United States Patent
Lee et al.

(10) Patent No.: US 9,343,553 B2
(45) Date of Patent: May 17, 2016

(54) PHOTORESIST COMPOSITION, METHOD OF FORMING A PATTERN AND METHOD OF MANUFACTURING A THIN FILM TRANSISTOR SUBSTRATE

(71) Applicant: SAMSUNG DISPLAY CO., LTD., Yongin, Gyeonggi-Do (KR)

(72) Inventors: Jung-Soo Lee, Seoul (KR); Jeong-Min Park, Seoul (KR); Sung-Kyun Park, Suwon-si (KR); Jun Chun, Yongin-si (KR); Ki-Hyun Cho, Suwon-so (KR); Ji-Hyun Kim, Suwon-si (KR); Dong-Min Kim, Hwaseong-si (KR); Seung-Ki Kim, Hwaseong-si (KR); Eun Jeagal, Hwaseong-si (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 14/522,713

(22) Filed: Oct. 24, 2014

(65) Prior Publication Data

US 2015/0205200 A1 Jul. 23, 2015

(30) Foreign Application Priority Data

Jan. 22, 2014 (KR) .................. 10-2014-0007997

(51) Int. Cl.
| | | |
|---|---|---|
| *G03F 7/023* | (2006.01) | |
| *G03F 7/075* | (2006.01) | |
| *H01L 21/311* | (2006.01) | |
| *H01L 29/66* | (2006.01) | |
| *G03F 7/022* | (2006.01) | |

(52) U.S. Cl.
CPC ........ *H01L 29/66969* (2013.01); *G03F 7/0226* (2013.01); *G03F 7/0236* (2013.01); *G03F 7/0751* (2013.01); *G03F 7/0755* (2013.01); *G03F 7/0757* (2013.01); *H01L 21/31144* (2013.01)

(58) Field of Classification Search
CPC ....... G03F 7/0226; G03F 7/0236; G03F 7/38; G03F 7/36; H01L 21/31144; H01L 29/66969

USPC ............ 430/191, 192, 193, 326, 18, 316, 318
See application file for complete search history.

(56) References Cited

U.S. PATENT DOCUMENTS

| | | | |
|---|---|---|---|
| 7,144,662 B2 | 12/2006 | Lee et al. | |
| 7,955,784 B2 | 6/2011 | Lee et al. | |
| 8,535,873 B2 | 9/2013 | Endo et al. | |
| 8,563,214 B2* | 10/2013 | Kikuchi | G03F 7/0226 430/165 |
| 2001/0041305 A1* | 11/2001 | Sawada | C22C 21/00 430/278.1 |
| 2002/0039703 A1* | 4/2002 | Hotta | B41N 3/038 430/302 |
| 2009/0215233 A1* | 8/2009 | Lee | G03F 7/0233 438/158 |

FOREIGN PATENT DOCUMENTS

| | | |
|---|---|---|
| JP | 07-056332 A | 3/1995 |
| JP | 3006253 B2 | 11/1999 |
| KR | 10-2004-0070740 A | 8/2004 |
| KR | 10-2004-0079095 A | 9/2004 |
| KR | 10-0741296 B1 | 7/2007 |
| KR | 10-2009-0001178 A | 1/2009 |
| KR | 10-2009-0019621 A | 2/2009 |
| KR | 10-2010-0094758 A | 8/2010 |
| KR | 10-1052764 B1 | 7/2011 |

* cited by examiner

*Primary Examiner* — John S Chu
(74) *Attorney, Agent, or Firm* — Lee & Morse, P.C.

(57) ABSTRACT

A photoresist composition, a method of forming a pattern, and a method of manufacturing a thin film transistor substrate, the composition including a solvent, a novolak resin, a diazide-based photo-sensitizer, an acryl compound represented by the following Chemical Formula 1:

<Chemical Formula 1>

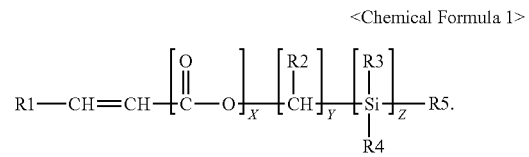

20 Claims, 9 Drawing Sheets

PHOTORESIST COMPOSITION, METHOD OF FORMING A PATTERN AND METHOD OF MANUFACTURING A THIN FILM TRANSISTOR SUBSTRATE

CROSS-REFERENCE TO RELATED APPLICATION

Korean Patent Application No. 10-2014-0007997, filed on Jan. 22, 2014, in the Korean Intellectual Property Office, and entitled: "Photoresist Composition, Method Of Forming A Pattern And Method Of Manufacturing A Thin Film Transistor Substrate," is incorporated by reference herein in its entirety.

BACKGROUND

1. Field

Embodiments relate to a photoresist composition, a method of forming a pattern, and a method of manufacturing a thin film transistor substrate.

2. Description of the Related Art

A display substrate that is used for a display device may include a thin film transistor that serves as a switching element for driving a pixel unit, a signal line connected to the thin film transistor, and a pixel electrode. The signal line may include a gate line providing a gate signal, and a data line crossing the gate line and providing a data signal.

A photolithography process may be used for forming the thin film transistor, the signal line, and the pixel electrode. According to the photolithography process, a photoresist pattern may be formed on an object layer, and the object layer may be patterned by using the photoresist pattern as a mask to form a desired pattern.

SUMMARY

Embodiments are directed to a photoresist composition, a method of forming a pattern, and a method of manufacturing a thin film transistor substrate.

The embodiments may be realized by providing a photoresist composition including a solvent; a novolak resin; a diazide-based photo-sensitizer; and an acryl compound represented by the following Chemical Formula 1, wherein: R1 is a hydrogen atom or a methyl group, R2 is an aromatic group or an alkyl group, the alkyl group having 1 to about 1,000 carbon atoms and having a linear shape or a branched shape, R3, R4 and R5 are each independently an alkoxyl group, the alkoxy group having 1 to about 1,000 carbon atoms and having a linear shape or a branched shape, and X, Y and Z are each independently an integer of 1 to about 100, <Chemical Formula 1>

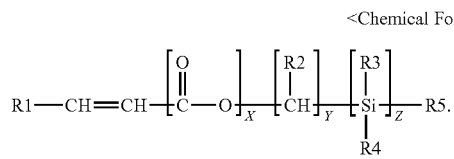

The composition may include about 5 to about 30% by weight of the novolak resin, about 2 to about 10% by weight of the diazide-based photo-sensitizer, about 0.03 to about 2% by weight of the acryl compound, and a balance of the solvent.

A weight average molecular weight of the acryl compound may be about 5,000 to about 30,000.

The acryl compound represented by Chemical Formula 1 may be represented by the following Chemical Formula 2, in which R6 is an alkyl group, the alkyl group having about 10 to about 70 carbon atoms and having a linear shape, and n is an integer of about 10 to about 40, <Chemical Formula 2>

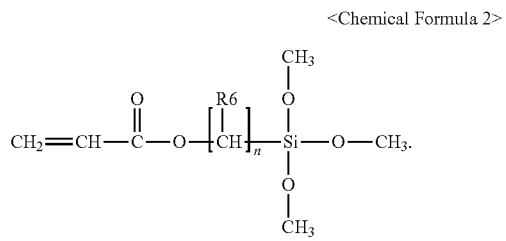

The diazide-based photo-sensitizer may include a product of reaction of a naphthoquinone diazide sulfonate halogen compound with a phenol compound.

The diazide-based photo-sensitizer may include at least one selected from the group of 2,3,4-trihydroxybenzophenone-1,2-naphthoquinonediazide-5-sulfonate, and 2,3,4,4-tetrahydroxybenzophenone-1,2-naphthoquinonediazide-5-sulfonate.

A weight average molecular weight of the novolak resin may be about 4,000 to about 30,000.

The solvent may include at least one selected from the group of a glycol ether, an ethylene glycol alkyl ether acetate, and a diethylene glycol.

The embodiments may be realized by providing a method of forming a pattern, the method including forming an object layer on a base substrate; coating a photoresist composition on the object layer to form a photoresist layer, the photoresist composition including a novolak resin, a photo-sensitizer, an acryl compound, and a solvent, the acryl compound being represented by the following Chemical Formula 1, wherein R1 is a hydrogen atom or a methyl group, R2 is an aromatic group or an alkyl group, the alkyl group having 1 to about 1,000 carbon atoms and having a linear shape or a branched shape, R3, R4, and R5 are each independently an alkoxyl group, the alkoxy group having 1 to about 1,000 carbon atoms and having a linear shape or a branched shape, and X, Y and Z are each independently an integer of 1 to about 100;

<Chemical Formula 1>

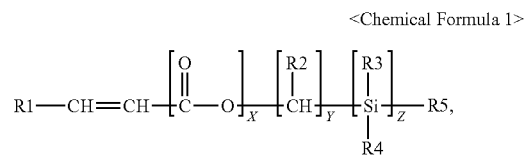

exposing the photoresist layer to a light; partially removing the photoresist layer to form a photoresist pattern; and patterning the object layer by using the photoresist pattern as a mask.

The photoresist composition may include about 5 to about 30% by weight of the novolak resin, about 2 to about 10% by weight of the diazide-based photo-sensitizer, about 0.03 to about 2% by weight of the acryl compound, and a balance of the solvent.

A weight average molecular weight of the acryl compound may be about 5,000 to about 30,000.

The acryl compound represented by Chemical Formula 1 may be represented by the following Chemical Formula 2, in which R6 is an alkyl group, the alkyl group having about 10 to about 70 carbon atoms and having a linear shape, and n is an integer of about 10 to about 40,

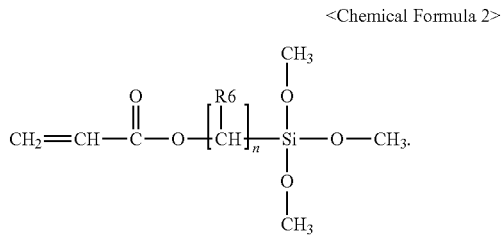

<Chemical Formula 2>

The object layer may include a metal oxide.

The metal oxide may include at least one selected from the group of zinc oxide, zinc tin oxide, zinc indium oxide, indium oxide, titanium oxide, indium gallium zinc oxide, indium zinc tin oxide, indium tin oxide, gallium zinc oxide, zinc aluminum oxide, and indium gallium oxide.

The embodiments may be realized by providing a method of manufacturing a thin film transistor substrate, the method including forming a gate electrode on a base substrate; forming a gate insulation layer covering the gate electrode; forming an oxide semiconductor layer on the gate insulation layer; forming a source metal layer on the oxide semiconductor layer such that the source metal layer includes a metal layer and a conductive oxide layer on the metal layer; coating a photoresist composition on the conductive oxide layer to form a first photoresist pattern, the photoresist composition including a novolak resin, a photo-sensitizer, an acryl compound, and a solvent, the acryl compound being represented by the following Chemical Formula 1, wherein R1 is a hydrogen atom or a methyl group, R2 is an aromatic group or an alkyl group, the alkyl group having 1 to about 1,000 carbon atoms and having a linear shape or a branched shape, R3, R4, and R5 are each independently an alkoxyl group, the alkoxy group having 1 to about 1,000 carbon atoms and having a linear shape or a branched shape, and X, Y and Z are each independently an integer of 1 to about 100;

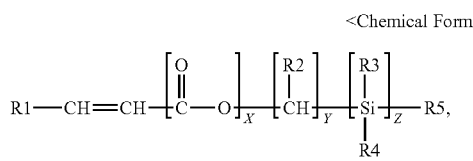

<Chemical Formula 1> etching the source metal layer by using the first photoresist pattern as a mask to form a source metal pattern; partially removing the first photoresist pattern to form a second photoresist pattern; and etching the source metal pattern by using the second photoresist pattern as a mask to form a source electrode and a drain electrode.

The photoresist composition may include about 5 to about 30% by weight of the novolak resin, about 2 to about 10% by weight of the diazide-based photo-sensitizer, about 0.03 to about 2% by weight of the acryl compound, and a balance of the solvent.

A weight average molecular weight of the acryl compound may be about 5,000 to about 30,000.

The acryl compound represented by Chemical Formula 1 may be represented by the following Chemical Formula 2, in which R6 is an alkyl group, the alkyl group having about 10 to about 70 carbon atoms and having a linear shape, and n is an integer of about 10 to about 40,

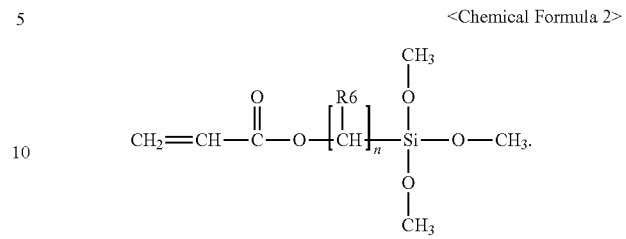

<Chemical Formula 2>

The conductive oxide layer may include at least one selected from the group of indium zinc oxide, indium tin oxide, gallium zinc oxide, and zinc aluminum oxide.

The first photoresist pattern may include a first thickness portion and a second thickness portion that is thinner than the first thickness portion.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
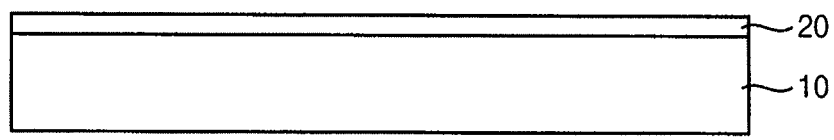
FIGS. 1 to 7 illustrate cross-sectional views of stages in a method of forming a pattern according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Photoresist Composition

A photoresist composition according to an exemplary embodiment may include, e.g., a novolak resin, a diazide-based photo-sensitizer, an acryl compound, and a solvent. For example, the photoresist composition may include about 5 to about 30% by weight of the novolak resin, about 2 to about 10% by weight of the diazide-based photo-sensitizer, about 0.03 to about 2% by weight of the acryl compound, and a balance or remainder of the solvent, e.g., based on a total weight of the composition. The photoresist composition may be a positive-type photoresist composition in which a solubility of a novolak resin is reduced when the photoresist composition is exposed to light.

The novolak resin may be alkali-soluble, and may be prepared by reaction of a phenol compound with an aldehyde compound or a ketone compound in the presence of an acidic catalyst.

Examples of the phenol compound may include phenol, o-cresol, m-cresol, p-cresol, 2,3-dimethylphenol, 3,4-dimethylphenol, 3,5-dimethylphenol, 2,4-dimethylphenol, 2,6-dimethylphenol, 2,3,6-trimethylphenol, 2-t-butylphenol, 3-t- butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol, isothymol, and the like. These may be used alone or in a combination thereof.

Examples of the aldehyde compound may include formaldehyde, formalin, p-formaldehyde, trioxane, acetaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-methylbenzaldehyde, m-methylbenzaldehyde, p-methylbenzaldehyde, p-ethylbenzaldehyde, p-n-butylbenzaldehyde, terephthalic acid aldehyde, and the like. These may be used alone or in a combination thereof.

Examples of the ketone compound may include acetone, methylethylketone, diethyl ketone, diphenyl ketone, and the like. These may be used alone or in a combination thereof.

Maintaining the content of the novolak resin at about 5% by weight or greater, based on the total weight of the photoresist composition, may help prevent a reduction in heat resistance of the photoresist composition, thereby reducing and/or preventing deformation of a photoresist pattern in a baking process. Maintaining the content of the novolak resin at about 30% by weight or less may help prevent a reduction in adhesive strength, a sensitivity, a residual ratio, or the like. In an implementation, the content of the novolak resin may be about 5% to about 30% by weight, based on the total weight of the photoresist composition, e.g., about 10% to about 25% by weight.

A weight average molecular weight of the novolak resin may be about 4,000 to 30,000. Maintaining the weight average molecular weight of the novolak resin at about 4,000 or greater may help prevent damage to a photoresist pattern caused by an alkali solution. Maintaining the weight average molecular weight of the novolak resin at about 30,000 or less may help prevent a reduction in difference between an exposed portion and an unexposed portion, thereby ensuring that a photoresist pattern having a clear shape may be formed.

Examples of the diazide-based photo-sensitizer may include a quinone diazide compound. The quinone diazide compound may be obtained by reaction of a naphthoquinone diazide sulfonate halogen compound with a phenol compound in the presence of a weak base.

Examples of the phenol compound may include 2,3,4-trihydroxybenzophenone, 2,4,6-trihydroxybenzophenone, 2,3,4,3'-tetrahydroxybenzophenone, 2,3,4,4'-tetrahydroxybenzophenone, tri(p-hydroxyphenyl)methane, 1,1,1-tri(p-hydroxyphenyl)ethane, 4,4'-[1-[4-[1-[4-hydroxyphenyl]-1-methylethyl]phenyl]ethylidene]diphenol, and the like. These may be used alone or in a combination thereof.

Examples of the naphthoquinone diazide sulfonate halogen compound may include 1,2-quinonediazide-4-sulfonic ester, 1,2-quinonediazide-5-sulfonic ester, 1,2-quinonediazide-6-sulfonic ester, and the like. These may be used alone or in a combination thereof.

In an implementation, the diazide-based photo-sensitizer may include, e.g., 2,3,4-trihydroxybenzophenone-1,2-naphthoquinonediazide-5-sulfonate, 2,3,4,4-tetrahydroxybenzophenone-1,2-naphthoquinonediazide-5-sulfonate, or the like. These may be used alone or in a combination thereof.

Maintaining the content of the diazide-based photo-sensitizer at about 2% by weight or greater, based on the total weight of the photoresist composition, may help prevent an increase in a solubility of an unexposed portion, thereby ensuring formation of a photoresist pattern. Maintaining the content of the diazide-based photo-sensitizer at about 10% by weight or less may help prevent a reduction in solubility of an exposed portion, thereby ensuring that a developing process may be performed. In an implementation, the content of the diazide-based photo-sensitizer may be about 2% to about 10% by weight, e.g., about 5% to about 8% by weight.

The acryl compound may help increase an adhesive strength of a photoresist pattern (formed from the photoresist composition) to an object layer contacting the photoresist pattern.

The acryl compound may be represented by the following Chemical Formula 1.

<Chemical Formula 1>

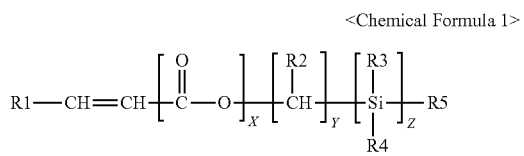

In Chemical Formula 1, R1 may be or may include a hydrogen atom or a methyl group. R2 may be or may include an aromatic group or an alkyl group (the alkyl group having 1 to about 1,000 carbon atoms and having a linear shape or a branched shape). R3, R4 and R5 may each independently be or include an alkoxyl group (having 1 to about 1,000 carbon atoms and having a linear shape or a branched shape). X, Y and Z may each independently be an integer of 1 to about 100. A weight average molecular weight of the acryl compound may be, e.g., about 5,000 to 30,000.

In an implementation, the acryl compound may be represented by the following Chemical Formula 2.

<Chemical Formula 2>

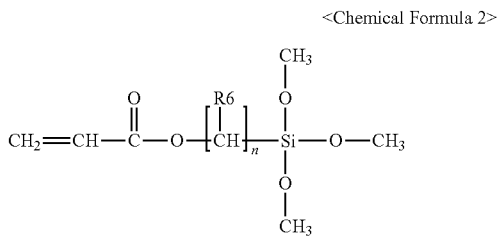

In Chemical Formula 2, R6 may be or may include an alkyl group (having about 10 to about 70 carbon atoms and having a linear shape). n may be an integer of about 10 to about 40.

Maintaining the content of the acryl compound at about 0.03% by weight or greater, based on the total weight of the photoresist composition, may help prevent a reduction in adhesive strength of the photoresist pattern to the object layer contacting the photoresist pattern. Thus, a reduction in taper angle of an etched pattern and a subsequent skew may be prevented. Maintaining the content of the acryl compound at about 2% by weight or less may help prevent a reduction in residual ratio of the photoresist pattern. In an implementation, the content of the acryl compound may be about 0.03% to about 2% by weight, e.g., about 0.1% to about 1% by weight.

Examples of the solvent may include alcohols such as methanol and ethanol, ethers such as tetrahydrofuran, glycol ethers such as ethylene glycol monomethyl ether and ethylene glycol monoethyl ether, ethylene glycol alkyl ether acetates such as methyl cellosolve acetate and ethyl cellosolve acetate, diethylene glycols such as diethylene glycol monomethyl ether, diethylene glycol monoethyl ether and diethylene glycol dimethyl ether, propylene glycol monoalkyl ethers such as propylene glycol methyl ether, propylene glycol ethyl ether, propylene glycol propyl ether and propylene glycol butyl ether, propylene glycol alkyl ether acetates such as propylene glycol methyl ether acetate, propylene glycol ethyl ether acetate, propylene glycol propyl ether acetate and propylene glycol butyl ether acetate, propylene glycol alkyl ether propionates such as propylene glycol methyl ether propionate, propylene glycol ethyl ether propionate, propylene glycol propyl ether propionate and propylene glycol butyl ether propionate, aromatic compounds such as toluene and xylene, ketones such as methyl ethyl ketone, cyclohexanone and 4-hydroxy-4-methyl-2-pentanone, and ester compounds such as methyl acetate, ethyl acetate, propyl acetate, butyl acetate, ethyl 2-hydroxypropionate, methyl 2-hydroxy-2-methyl propionate, ethyl 2-hydroxy-2-methyl propionate, methyl hydroxyacetate, ethyl hydroxyacetate, butyl hydroxyacetate, methyl lactate, ethyl lactate, propyl lactate sulfate, butyl lactate, methyl 3-hydroxypropionate, ethyl 3-hydroxypropionate, propyl 3-hydroxypropionate, butyl 3-hydroxypropionate, methyl 2-hydroxy-3-methyl butanoate, methyl methoxy acetate, ethyl methoxy acetate, propyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, etc. Among the above examples, glycol ethers, ethylene glycol alkyl ether acetates, and diethylene glycols may be used in view of the solubility and reactivity of each of the components composing the photoresist composition.

In an implementation, the content of the solvent may be about 60% to about 90% by weight, based on the total weight of the photoresist composition.

In an implementation, the photoresist composition may further include about 0.1% to about 3% by weight of an additive. For example, the additive may include a surfactant and/or an adhesion enhancer.

The photoresist composition may help increase an adhesive strength of a photoresist pattern (formed from the photoresist composition) to an object layer. Thus, a reliability of a photolithography process may be improved.

The object layer under the photoresist pattern may include a metal oxide. The metal oxide may include a conductive oxide and/or an oxide semiconductor. Examples of the metal oxide may include zinc oxide, zinc tin oxide, zinc indium oxide, indium oxide, titanium oxide, indium gallium zinc oxide, indium zinc tin oxide, indium tin oxide, gallium zinc oxide, zinc aluminum oxide, indium gallium oxide, or the like.

Hereinafter, a method of forming a pattern and a method of manufacturing a thin film transistor substrate according to exemplary embodiments will be more fully explained with reference to the accompanying drawings.

Method of Forming a Pattern

FIGS. 1 to 7 illustrate cross-sectional views of stages in a method of forming a pattern according to an exemplary embodiment.

Referring to FIG. 1, an object layer 20 may be formed on a base substrate 10. A material that may be used for the object layer 20 may include, e.g., a metal oxide. The metal oxide may include, e.g., a conductive oxide and/or an oxide semiconductor. Examples of the metal oxide may include zinc oxide, zinc tin oxide, zinc indium oxide, indium oxide, titanium oxide, indium gallium zinc oxide, indium zinc tin oxide, indium tin oxide, gallium zinc oxide, zinc aluminum oxide, indium gallium oxide, and the like.

The object layer 20 may have a single-layered structure of a metal oxide or a multiple-layered structure further including a metal layer. For example, the object layer 20 may include a copper layer and a conductive oxide layer on and/or under the copper layer.

Figure 2:
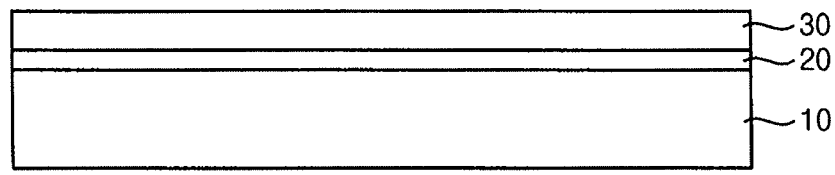

Referring to FIG. 2, a photoresist composition may be coated on the object layer 20 to form a photoresist layer 30.

The photoresist composition may include the composition according to an embodiment. For example, the composition may include a novolak resin, a diazide-based photo-sensitizer, an acryl compound, and a solvent. For example, the photoresist composition may include about 5% to about 30% by weight of the novolak resin, about 2% to about 10% by weight of the diazide-based photo-sensitizer, about 0.03% to about 2% by weight of the acryl compound, and a balance of the solvent. The photoresist composition may be substantially the same as the above-described photoresist composition according to an exemplary embodiment. Thus, a repeated explanation may be omitted.

The photoresist composition may be coated through, e.g., spin coating or the like.

Figure 3:
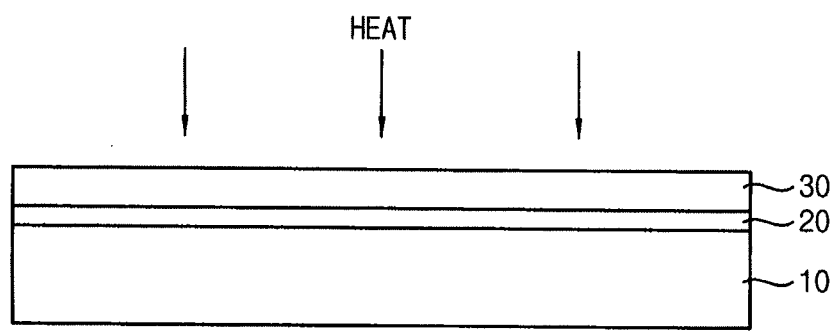

Referring to FIG. 3, heat may be provided to the base substrate 10 having the photoresist layer 30 thereon for a soft-baking process. For example, the base substrate 10 may be heated on a heat plate. A heating temperature may be, e.g., about 80° C. to about 120° C.

Through the soft-baking process, the solvent may be partially removed, and shape reliability of the photoresist layer 30 may be improved.

Figure 4:
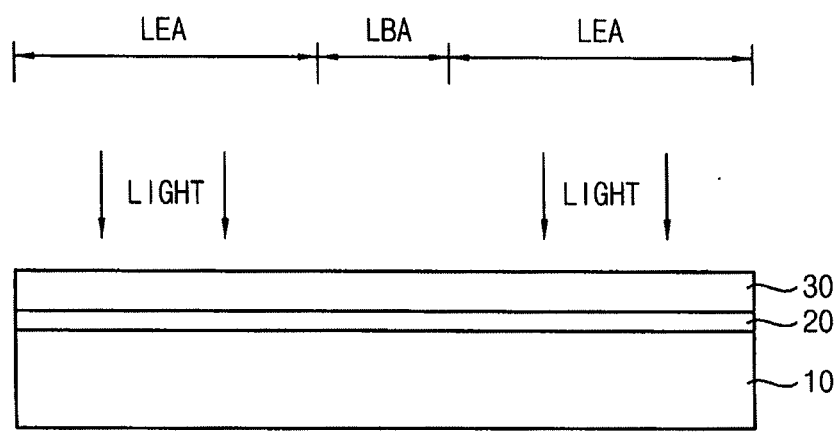

Referring to FIG. 4, the photoresist layer 30 may be partially exposed to a light. For example, the photoresist layer 30 may be partially exposed to a light through a mask including a light-transmission portion (corresponding to a light-exposing area LEA) and a light-blocking layer (corresponding to a light-blocking area LBA).

For example, when the photoresist composition is for a positive type photoresist, a photo-sensitizer in the light-exposing area LEA of the photoresist layer 30 may be activated. Thus, a solubility of the light-exposing area LEA of the photoresist layer 30 may be increased.

Figure 5:
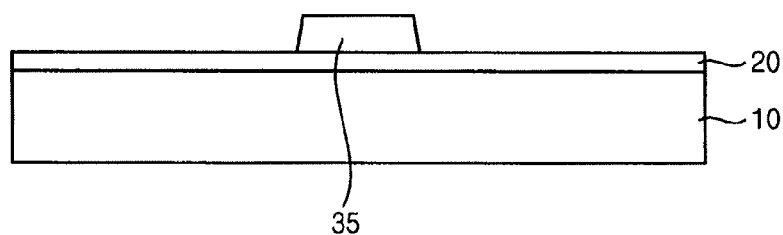

Referring to FIG. 5, a developing solution may be provided to the light-exposed portion of the photoresist layer 30 to partially remove the photoresist layer 30. The developing solution may include tetramethylammonium hydroxide or the like.

When the photoresist composition is for a positive type photoresist, the light-exposing area LEA of the photoresist layer 30 may be removed to expose the object layer 20, and the light-blocking area LBA of the photoresist layer 30 may remain to form a photoresist pattern 35.

A hard-baking process may be performed to increase an adhesive strength of the photoresist pattern 35. For example, the hard-baking process may be performed at a temperature of about 130° C. to about 160° C.

In the hard-baking process, the acryl compound may absorb heat energy to generate a free radical, which may induce a chemical reaction of a metal oxide.

Figure 6:
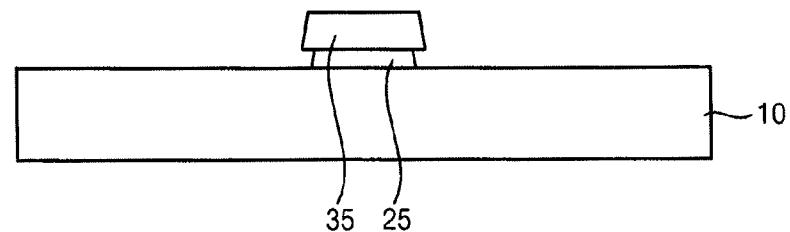
Figure 7:
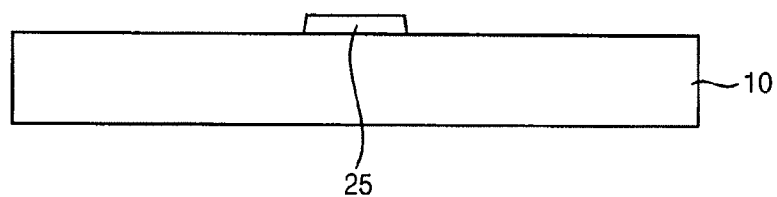

Referring to FIGS. 6 and 7, the object layer 20 may be patterned by using the photoresist pattern 35 as a mask to form a pattern 25. Thereafter, the photoresist pattern 35 may be removed. Thus, the pattern 25 may have a shape corresponding to the photoresist pattern 35.

For example, the object layer 20 may be patterned through a wet-etching process using an etching composition. The etching composition may be selected depending on a material of the object layer 20.

The photoresist composition according to an exemplary embodiment may help increase an adhesive strength of a photoresist pattern. Thus, a skew of an etched pattern under the photoresist pattern may be reduced.

FIGS. 8 to 18 illustrate cross-sectional views of stages in a method of manufacturing a thin film transistor substrate according to an exemplary embodiment.

Figure 8:
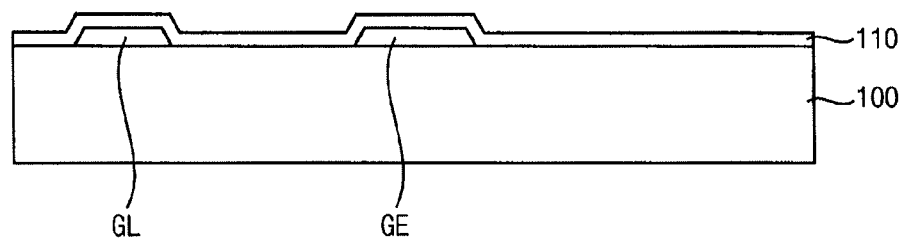
FIGS. 8 to 18 illustrate cross-sectional views of stages in a method of manufacturing a thin film transistor substrate according to an exemplary embodiment.

Referring to FIG. 8, a gate line GL and a gate electrode GE may be formed on a base substrate 100. For example, a gate metal layer may be formed on the base substrate 100, and may then be patterned to form the gate line GL and the gate electrode GE. Examples of the base substrate 100 may include a glass substrate, a quartz substrate, a silicon substrate, a plastic substrate, and the like.

Examples of a material that may be used for the gate metal layer may include copper, silver, chromium, molybdenum, aluminum, titanium, manganese, or an alloy thereof. The gate metal layer may have a single-layered structure or may have a multiple-layered structure including different materials. For example, the gate metal layer may include a copper layer and a titanium layer on and/or under the copper layer.

In an implementation, the gate metal layer may include a metal layer and a conductive oxide layer on and/or under the metal layer. For example, the gate metal layer may include a copper layer and a conductive oxide layer on and/or under the copper layer. Examples of a material that may be used for the conductive oxide layer may include indium zinc oxide, indium tin oxide, gallium zinc oxide, and zinc aluminum oxide.

Thereafter, a gate insulation layer 110 may be formed to cover the gate line GL and the gate electrode GE. The gate insulation layer 110 may include silicon nitride, silicon oxide, or the like. The gate insulation layer 110 may have a single-layered structure or a multiple-layered structure. For example, the gate insulation layer 110 may include a lower insulation layer (including silicon nitride) and an upper insulation layer (including silicon oxide).

Figure 9:
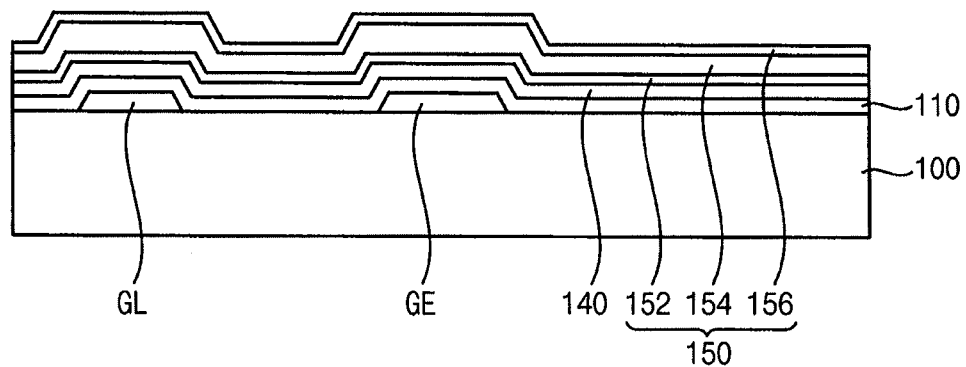

Referring to FIG. 9, an oxide semiconductor layer 140 and a source metal layer 150 may be formed on the gate insulation layer 110. The source metal layer may include a lower conductive oxide layer 152, a metal layer 154, and an upper conductive oxide layer 156, which may be sequentially deposited on the oxide semiconductor layer 140.

Examples of a material that may be used for the oxide semiconductor layer 140 may include zinc oxide, zinc tin oxide, zinc indium oxide, indium oxide, titanium oxide, indium gallium oxide, indium tin oxide, or the like.

The oxide semiconductor layer 140 may be formed through a suitable method for forming an oxide semiconductor layer. In an implementation, the oxide semiconductor layer 140 may be formed through a physical vapor deposition such as a vacuum deposition process or a sputtering process.

For example, in order to form the oxide semiconductor layer 140, a source having similar composition to the oxide semiconductor layer 140 may be used as a target of a sputtering process.

In an implementation, after the oxide semiconductor layer 140 is formed, an annealing process for heating the oxide semiconductor layer 140 may be performed. In an implementation, the annealing process may be performed at a temperature of about 100° C. to about 700° C., e.g., about 300° C. to about 400° C. Electrical characteristics of the oxide semiconductor layer 140 may be improved through the annealing process.

The lower conductive oxide layer 152 and the upper conductive oxide layer 156 may include a conductive oxide. Examples of the conductive oxide may include indium zinc oxide, indium tin oxide, gallium zinc oxide, zinc aluminum oxide, and the like.

In an implementation, the metal layer 154 may include copper.

Figure 10:
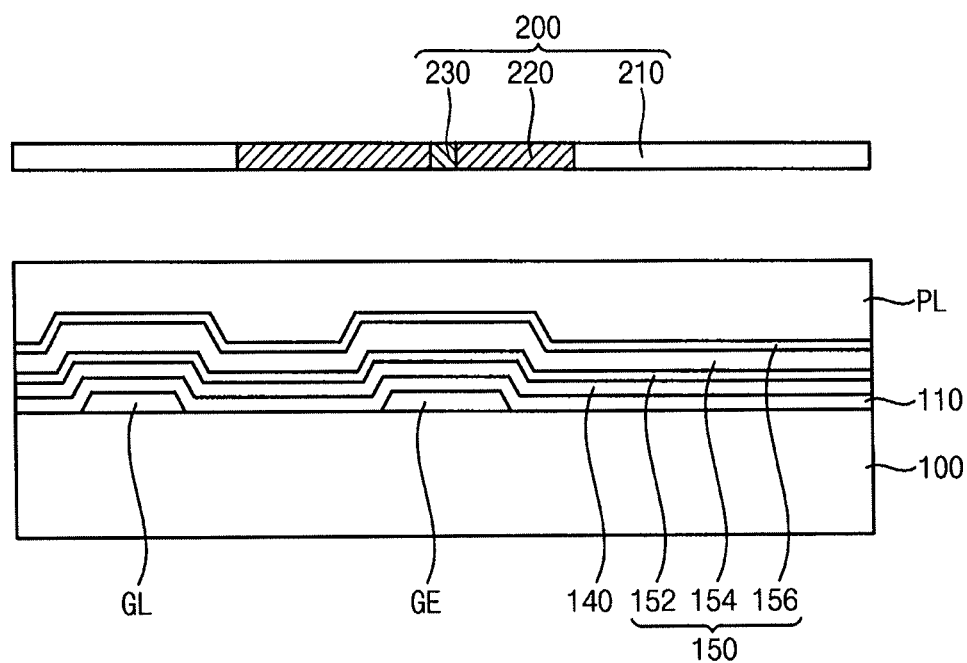

Referring to FIG. 10, a photoresist composition may be coated on the source metal layer 150 to form a photoresist layer PL, and pre-baked. For example, the photoresist composition may be pre-baked at about 80° C. to about 120° C.

The photoresist composition may include the composition according to an embodiment as described above, e.g., may include a novolak resin, a diazide-based photo-sensitizer, an acryl compound, and a solvent. For example, the photoresist composition may include about 5% to about 30% by weight of the novolak resin, about 2% to about 10% by weight of the diazide-based photo-sensitizer, about 0.03% to about 2% by weight of the acryl compound, and a balance of the solvent.

The photoresist composition may be substantially the same as the above-described photoresist composition according to an exemplary embodiment. Thus, a repeated explanation may be omitted.

A mask 200 (including a transmission portion 210, a half-transmission portion 230, and a blocking portion 220) may be disposed on or over the photoresist layer PL, and the photoresist layer PL may be exposed to a light through the mask 200. A photo-sensitizer in the light-exposed portion the photoresist layer PL may be activated so that a solubility to a developing solution, e.g., an alkali solution, may be increased. Thus, when the developing solution is provided to the photoresist layer PL, a portion of the photoresist layer PL overlapping with or underlying the transmission portion 210 may be removed, and a portion of the photoresist layer PL overlapping with or underlying the blocking portion 220 may remain. A portion of (e.g., but not all of) the photoresist layer PL overlapping with or underlying the half-transmission portion 230 may remain.

Figure 11:
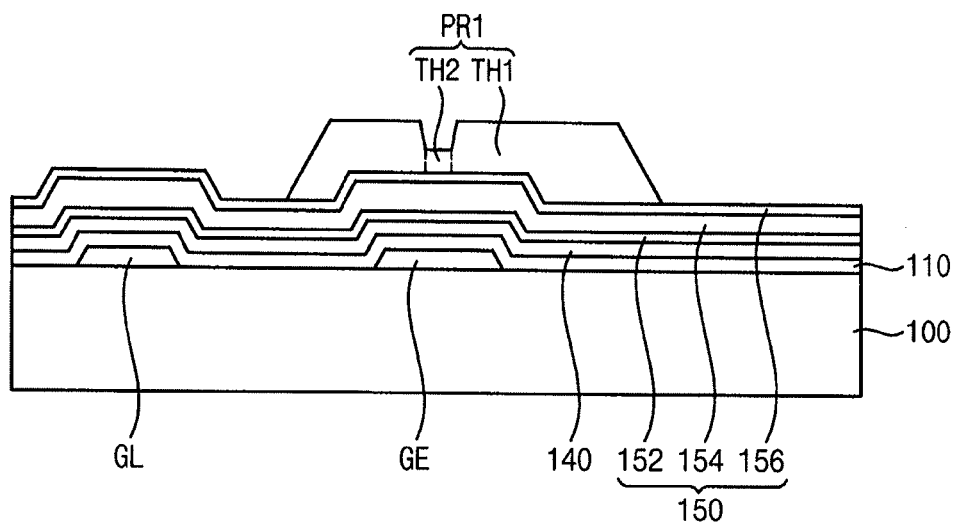

Referring to FIG. 11, a first photoresist pattern PR1 may be formed from the photoresist layer PL on the source metal layer 150. The first photoresist pattern PR1 may have a thickness gradient or difference. For example, the first photoresist pattern PR1 may include a first thickness portion TH1 and a second thickness portion TH2 that is thinner than the first thickness portion TH1. The second thickness portion TH2 may overlap with or overlie an active pattern that will be between a source electrode and a drain electrode, which will be explained in greater detail below.

A hard-baking process may be further performed to help increase an adhesive strength of the first photoresist pattern PR1. For example, the hard-baking process may be performed at a temperature of about 130° C. to about 160° C.

Figure 12:
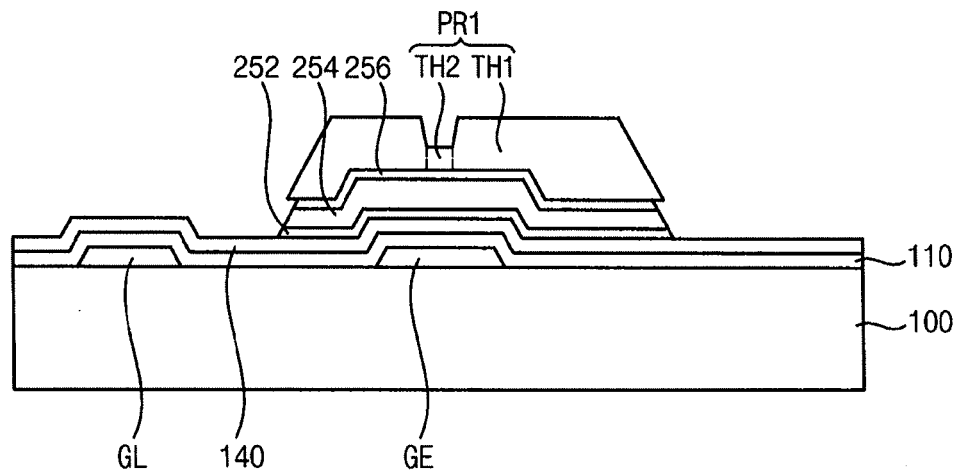

Referring to FIG. 12, the source metal layer 150 may be etched by using the first photoresist pattern PR1 as a mask to form a source metal pattern. The source metal pattern may include a lower conductive oxide pattern 252, a metal pattern 254, and an upper conductive oxide pattern 256. A portion of the source metal pattern may overlap with or overlie the gate electrode GE, and another portion of the source metal pattern may form a data line. As the source metal layer 150 is etched, the oxide semiconductor layer 140 may be partially exposed.

The source metal layer 150 may be etched through a wet-etching process using an etchant. The etchant may not substantially etch the oxide semiconductor layer 140.

The first photoresist pattern PR1 may have an increased adhesive strength to the upper conductive oxide layer 156 that contacts the first photoresist pattern PR1. Thus, a skew that may otherwise be formed or occur in the process of etching the source metal layer 150 may be reduced and/or prevented.

Figure 13:
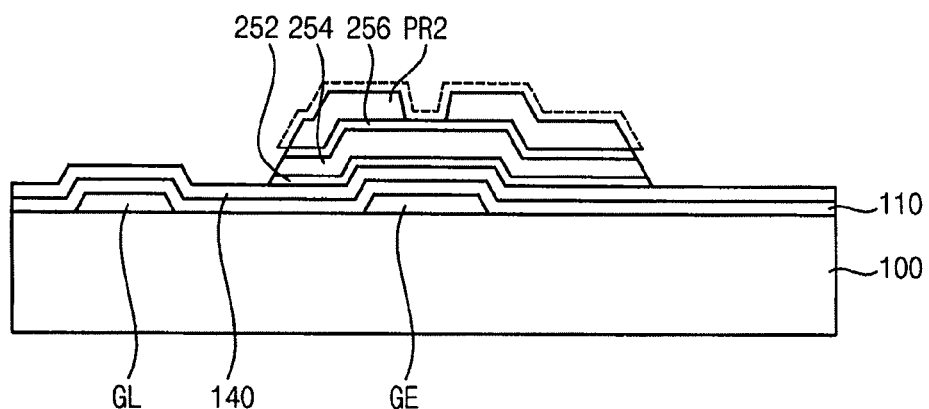

Referring to FIG. 13, the first photoresist pattern PR1 may be partially removed through, e.g., an ashing process or the like. As a result, the second thickness portion TH2 may be removed, and the first thickness portion TH1 may partially remain to form a second photoresist pattern PR2.

The second photoresist pattern PR2 may partially cover an upper surface of the source metal pattern so that the upper surface of the source metal pattern may be partially exposed.

Figure 14:
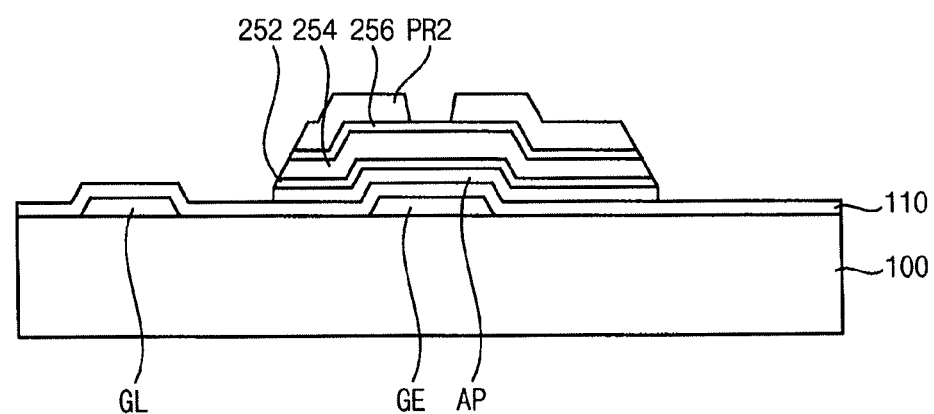

Referring to FIG. 14, portions of the oxide semiconductor layer 140 may be etched to form an active pattern AP. The oxide semiconductor layer 140 may be etched through a dry-etching process.

In an implementation, the oxide semiconductor layer 140 may be etched through a wet-etching process instead of a dry-etching process. For example, the oxide semiconductor layer 140 may be etched with the source metal layer 150 before the ashing process.

Figure 15:
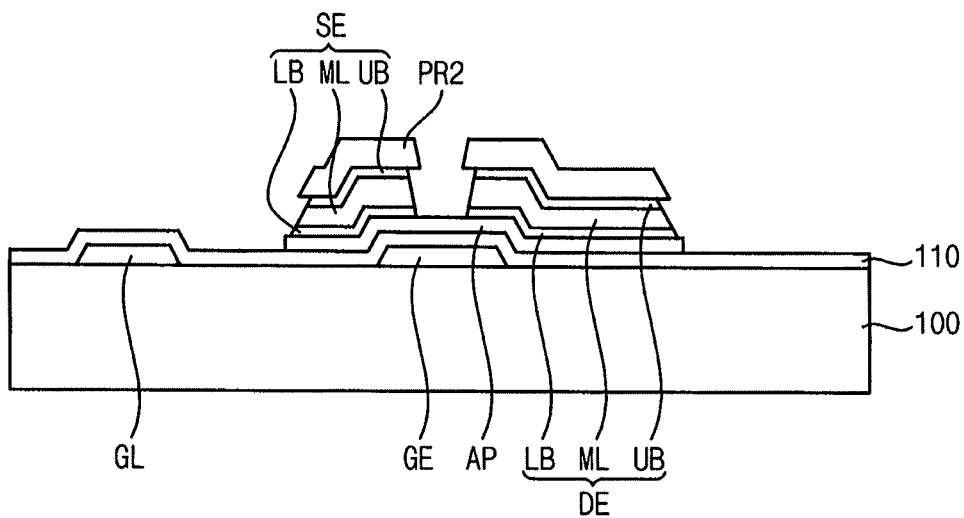

Referring to FIG. 15, the source metal pattern may be etched by using the second photoresist pattern PR2 as a mask to form a source electrode SE and a drain electrode DE and to partially expose an upper surface of the active pattern AP. As a result, a thin film transistor may be formed. The source electrode SE and the drain electrode DE may respectively or each include a lower barrier layer LB, a metal layer ML on the lower barrier layer LB, and an upper barrier layer UB on the metal layer ML.

The source metal pattern may be etched through a wet-etching process, and an etchant (e.g., the same as the etchant used for etching the source metal layer 150) may be used.

The second photoresist pattern PR2 may have an increased adhesive strength to the upper conductive oxide pattern 256 that contacts the second photoresist pattern PR2. Thus, a skew that may otherwise be formed or occur in or during the process of etching the source metal pattern may be reduced and/or prevented. Therefore, a channel length of a thin film transistor may be substantially reduced, thereby improving electrical characteristics of the thin film transistor.

Figure 16:
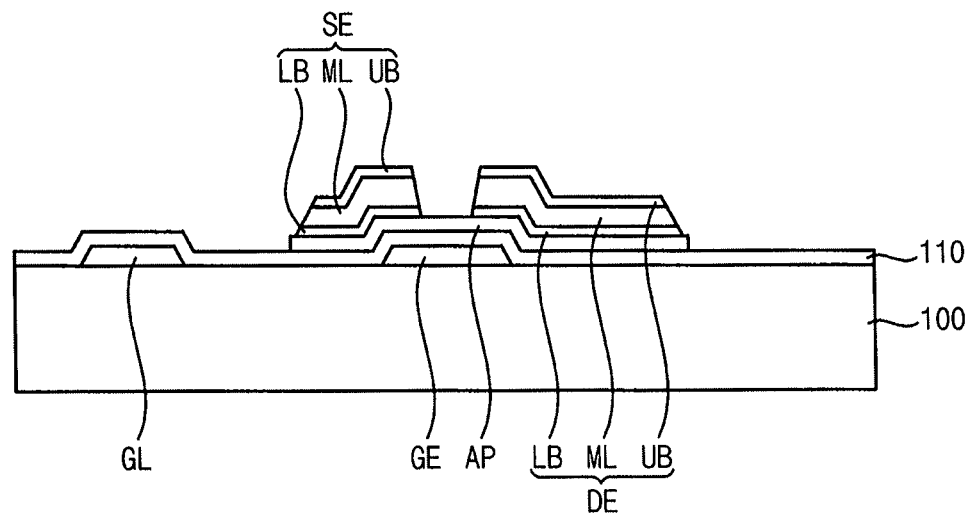

Referring to FIG. 16, the second photoresist pattern PR2 may be removed.

Figure 17:
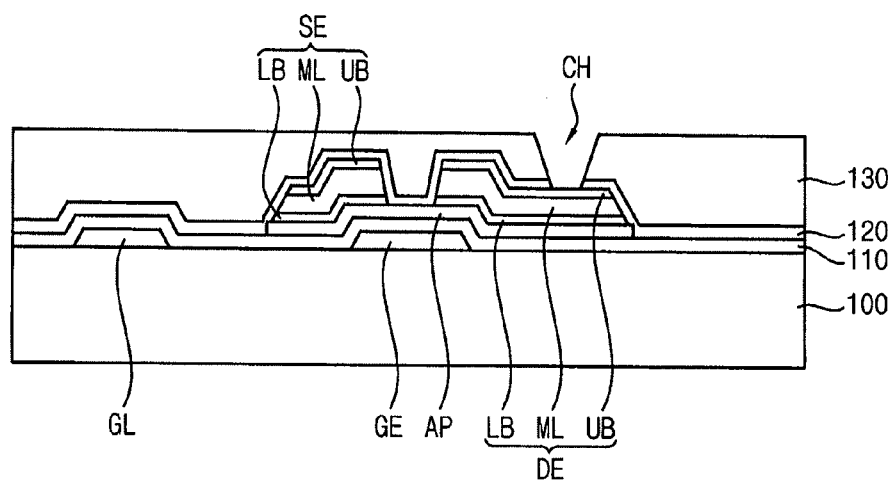

Referring to FIG. 17, a passivation layer 120 may be formed to cover the thin film transistor, and an organic insulation layer 130 may be formed on the passivation layer 120.

The passivation layer 120 may include an inorganic insulation material. For example, the passivation layer 120 may include silicon oxide, silicon nitride, or the like.

The organic insulation layer 130 may include an organic insulation material. The organic insulation layer 130 may planarize a surface of the substrate. A photoresist composition may be spin-coated to form the organic insulation layer 130. In an implementation, a color filter may be formed on the passivation layer 120 instead of the organic insulation layer 130, or may be formed between the passivation layer 120 and the organic insulation layer 130.

Figure 18:
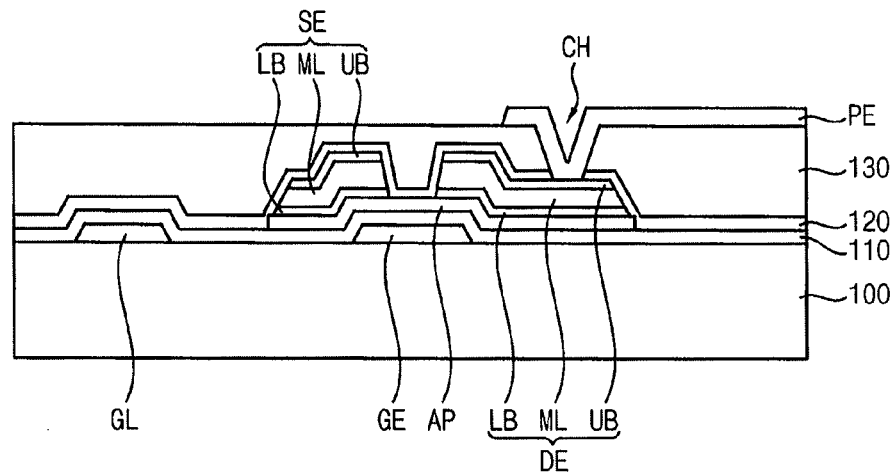

Referring to FIGS. 17 and 18 a contact hole CH may be formed through the organic insulation layer 130 and the passivation layer 120 to expose the drain electrode DE. A transparent conductive layer may be formed on the organic insulation layer 130. Examples of a material that may be used for the transparent conductive layer may include indium tin oxide, indium zinc oxide, and the like. A portion of the transparent conductive layer may contact the drain electrode DE through the contact hole CH.

Thereafter, the transparent conductive layer may be patterned to form a pixel electrode PE. An alignment layer (not illustrated) may be formed on the pixel electrode PE to align liquid crystal molecules. In an implementation, the display substrate may further include a common electrode for forming an electric filed with the pixel electrode PE and being on or under the pixel electrode PE.

In an implementation, the photoresist composition may be coated on the source metal layer to form a photoresist pattern used for etching the source metal layer. In an implementation, the photoresist composition may be coated on the oxide semiconductor layer to form a photoresist pattern used for etching the oxide semiconductor layer to form the active pattern.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

A photoresist composition including about 24 g of a cresol-novolak resin (which had a weight average molecular weight of about 6,000 and was prepared through condensation reaction of cresol monomer including m-cresol and p-cresol in a weight ratio of about 6:4 with formaldehyde), about 6 g of a photo-sensitizer (including 2,3,4-trihydroxybenzophenone-1,2-naphthoquinonediazide-5-sulfonate and 2,3,4,4-tetrahydroxybenzophenone-1,2-naphthoquinonediazide-5-sulfonate in a weight ratio of about 3:7), about 0.5 g of an acryl compound (having a weight average molecular weight of about 20,000), and about 70 g of propylene glycol methyl ether acetate as a solvent was prepared. The acryl compound is represented by the following Chemical Formula 2.

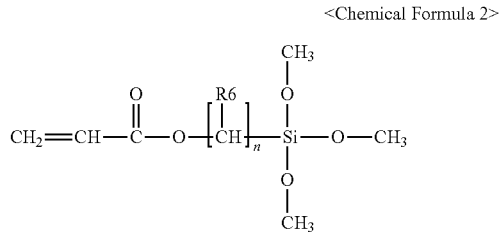

<Chemical Formula 2>

In Chemical Formula 2, R6 is an alkyl group, the alkyl group having 10 to 70 carbon atoms and having a linear shape. n is an integer of 10 to 40.

Example 2

A photoresist composition including about 24 g of a cresol-novolak resin (which had a weight average molecular weight of about 25,000 and was prepared through condensation reaction of cresol monomer including m-cresol and p-cresol in a weight ratio of about 5:5 with formaldehyde), about 6 g of a photo-sensitizer (including 2,3,4-trihydroxybenzophenone-1,2-naphthoquinonediazide-5-sulfonate and 2,3,4,4-tetrahydroxybenzophenone-1,2-naphthoquinonediazide-5-sulfonate in a weight ratio of about 3:7), about 0.5 g of the acryl compound in Example 1, and about 70 g of propylene glycol methyl ether acetate as a solvent was prepared.

Comparative Example 1

A photoresist composition including about 24 g of a cresol-novolak resin (which had a weight average molecular weight of about 6,000 and was prepared through condensation reaction of cresol monomer including m-cresol and p-cresol in a weight ratio of about 6:4 with formaldehyde), about 6 g of a photo-sensitizer (including 2,3,4-trihydroxybenzophenone-1,2-naphthoquinonediazide-5-sulfonate and 2,3,4,4-tetrahydroxybenzophenone-1,2-naphthoquinonediazide-5-sulfonate in a weight ratio of about 3:7), and about 70 g of propylene glycol methyl ether acetate as a solvent was prepared.

Comparative Example 2

A photoresist composition including about 24 g of a cresol-novolak resin (which had a weight average molecular weight of about 25,000 and was prepared through condensation reaction of cresol monomer including m-cresol and p-cresol in a weight ratio of about 5:5 with formaldehyde), about 6 g of a photo-sensitizer (including 2,3,4-trihydroxybenzophenone-1,2-naphthoquinonediazide-5-sulfonate and 2,3,4,4-tetrahydroxybenzophenone-1,2-naphthoquinonediazide-5-sulfonate in a weight ratio of about 3:7), and about 70 g of propylene glycol methyl ether acetate as a solvent was prepared.

Experiment—Skew

A gallium zinc oxide layer was formed on a glass substrate. Each of the photoresist compositions of Example 1, Example 2, Comparative Example 1, and Comparative Example 2 was coated on the gallium zinc oxide layer and vacuum-dried at about 0.5 torr for about 60 seconds, and heat-dried at about 110° C. for about 90 seconds to form a photoresist layer having a thickness of about 1.9 μm.

Thereafter, the photoresist layer was partially exposed to a light by using a light-exposure device, and a water solution including tetramethylammonium hydroxide was applied to the coated layer for about 60 seconds to form a photoresist pattern. Thereafter, the photoresist pattern was hard-baked at about 130° C. for about 90 seconds Thereafter, the gallium indium oxide layer exposed through the photoresist pattern was etched, and a skew of an obtained pattern was measured. The results are shown in the following Table 1.

TABLE 1

|  | Skew (nm) |
|---|---|
| Example 1 | 1,056 |
| Example 2 | 1,099 |
| Comparative Example 1 | 1,340 |
| Comparative Example 2 | 1,543 |

Referring to Table 1, it may be seen that gallium zinc oxide patterns formed by using the photoresist compositions of Examples 1 and 2 (including the acryl compound represented by Chemical Formula 2) had reduced or lower skews, compared to gallium zinc oxide patterns formed by using the photoresist compositions of Comparative Examples 1 and 2 (not including the acryl compound). Thus, it may be noted that photoresist compositions according to exemplary embodiments may help increase an adhesive strength of a photoresist pattern.

By way of summation and review, in the photolithography process, when an adhesive strength between the photoresist pattern and the object layer is low, a skew of an obtained pattern may increase. Thus, a defect or a failure of the obtained pattern may occur, and forming a fine pattern may be difficult.

The embodiments may provide a photoresist composition that may help improve an adhesive strength to a metal oxide.

The embodiments may provide a photoresist composition capable of forming a photoresist pattern having an improved adhesive strength with respect to an object layer.

According to embodiments, a photoresist composition may help increase an adhesive strength of a photoresist pattern formed from the photoresist composition to an object layer such as a metal oxide layer. Thus, a reliability of a photolithography process may be improved.

Furthermore, the photoresist pattern having an increased adhesive strength may help reduce a skew that may be formed in an etching process. Therefore, a channel length of a thin film transistor may be substantially reduced, thereby improving electrical characteristics of the thin film transistor.

Exemplary embodiment may be used for manufacturing various electronic devices, which may be formed through a photolithography process, such as a liquid crystal display device, an organic electroluminescence display device or the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photoresist composition, comprising:
   a solvent;
   a novolak resin;
   a diazide-based photo-sensitizer; and
   an acryl compound represented by the following Chemical Formula 1, wherein:
   R1 is a hydrogen atom or a methyl group,
   R2 is an aromatic group or an alkyl group, the alkyl group having 1 to about 1,000 carbon atoms and having a linear shape or a branched shape,
   R3, R4 and R5 are each independently an alkoxyl group, the alkoxy group having 1 to about 1,000 carbon atoms and having a linear shape or a branched shape, and
   X, Y and Z are each independently an integer of 1 to about 100, <Chemical Formula 1>

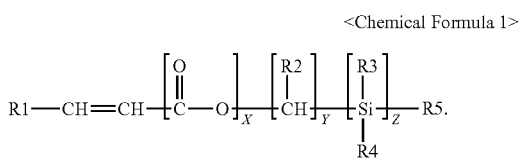

2. The photoresist composition as claimed in claim 1, wherein the composition includes:
about 5 to about 30% by weight of the novolak resin,
about 2 to about 10% by weight of the diazide-based photo-sensitizer,
about 0.03 to about 2% by weight of the acryl compound, and
a balance of the solvent.

3. The photoresist composition as claimed in claim 2, wherein a weight average molecular weight of the acryl compound is about 5,000 to about 30,000.

4. The photoresist composition as claimed in claim 3, wherein the acryl compound represented by Chemical Formula 1 is represented by the following Chemical Formula 2, in which:
R6 is an alkyl group, the alkyl group having about 10 to about 70 carbon atoms and having a linear shape, and
n is an integer of about 10 to about 40, <Chemical Formula 2>

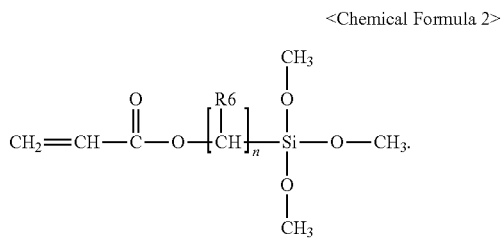

5. The photoresist composition as claimed in claim 2, wherein the diazide-based photo-sensitizer includes a product of reaction of a naphthoquinone diazide sulfonate halogen compound with a phenol compound.

6. The photoresist composition as claimed in claim 5, wherein the diazide-based photo-sensitizer includes at least one selected from the group of 2,3,4-trihydroxybenzophenone-1,2-naphthoquinonediazide-5-sulfonate, and 2,3,4,4-tetrahydroxybenzophenone-1,2-naphthoquinonediazide-5-sulfonate.

7. The photoresist composition as claimed in claim 2, wherein a weight average molecular weight of the novolak resin is about 4,000 to about 30,000.

8. The photoresist composition as claimed in claim 2, wherein the solvent includes at least one selected from the group of a glycol ether, an ethylene glycol alkyl ether acetate, and a diethylene glycol.

9. A method of forming a pattern, the method comprising:
forming an object layer on a base substrate;
coating a photoresist composition on the object layer to form a photoresist layer, the photoresist composition including a novolak resin, a photo-sensitizer, an acryl compound, and a solvent, the acryl compound being represented by the following Chemical Formula 1, wherein:
R1 is a hydrogen atom or a methyl group,
R2 is an aromatic group or an alkyl group, the alkyl group having 1 to about 1,000 carbon atoms and having a linear shape or a branched shape,
R3, R4, and R5 are each independently an alkoxyl group, the alkoxy group having 1 to about 1,000 carbon atoms and having a linear shape or a branched shape, and
X, Y and Z are each independently an integer of 1 to about 100;

<Chemical Formula 1>

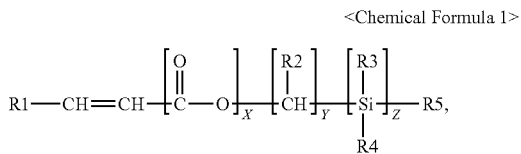

exposing the photoresist layer to a light;
partially removing the photoresist layer to form a photoresist pattern; and
patterning the object layer by using the photoresist pattern as a mask.

10. The method as claimed in claim 9, wherein the photoresist composition includes:
about 5 to about 30% by weight of the novolak resin,
about 2 to about 10% by weight of the diazide-based photo-sensitizer,
about 0.03 to about 2% by weight of the acryl compound, and a balance of the solvent.

11. The method as claimed in claim 10, wherein a weight average molecular weight of the acryl compound is about 5,000 to about 30,000.

12. The method as claimed in claim 11, wherein the acryl compound represented by Chemical Formula 1 is represented by the following Chemical Formula 2, in which:
R6 is an alkyl group, the alkyl group having about 10 to about 70 carbon atoms and having a linear shape, and
n is an integer of about 10 to about 40, <Chemical Formula 2>

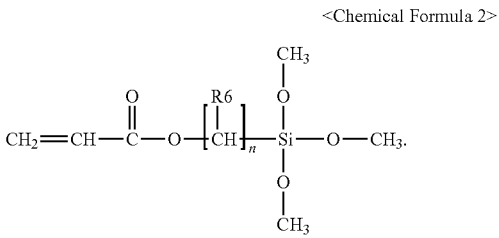

13. The method as claimed in claim 9, wherein the object layer includes a metal oxide.

14. The method as claimed in claim 13, wherein the metal oxide includes at least one selected from the group of zinc oxide, zinc tin oxide, zinc indium oxide, indium oxide, titanium oxide, indium gallium zinc oxide, indium zinc tin oxide, indium tin oxide, gallium zinc oxide, zinc aluminum oxide, and indium gallium oxide.

15. A method of manufacturing a thin film transistor substrate, the method comprising:
forming a gate electrode on a base substrate;
forming a gate insulation layer covering the gate electrode;
forming an oxide semiconductor layer on the gate insulation layer;
forming a source metal layer on the oxide semiconductor layer such that the source metal layer includes a metal layer and a conductive oxide layer on the metal layer;

coating a photoresist composition on the conductive oxide layer to form a first photoresist pattern, the photoresist composition including a novolak resin, a photo-sensitizer, an acryl compound, and a solvent, the acryl compound being represented by the following Chemical Formula 1, wherein:
R1 is a hydrogen atom or a methyl group,
R2 is an aromatic group or an alkyl group, the alkyl group having 1 to about 1,000 carbon atoms and having a linear shape or a branched shape,
R3, R4, and R5 are each independently an alkoxyl group, the alkoxy group having 1 to about 1,000 carbon atoms and having a linear shape or a branched shape, and
X, Y and Z are each independently an integer of 1 to about 100;

<Chemical Formula 1>

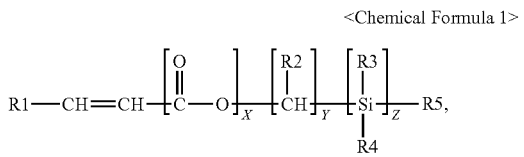

etching the source metal layer by using the first photoresist pattern as a mask to form a source metal pattern;
partially removing the first photoresist pattern to form a second photoresist pattern; and
etching the source metal pattern by using the second photoresist pattern as a mask to form a source electrode and a drain electrode.

16. The method as claimed in claim 15, wherein the photoresist composition includes:
about 5 to about 30% by weight of the novolak resin,
about 2 to about 10% by weight of the diazide-based photosensitizer,
about 0.03 to about 2% by weight of the acryl compound, and
a balance of the solvent.

17. The method as claimed in claim 16, wherein a weight average molecular weight of the acryl compound is about 5,000 to about 30,000.

18. The method as claimed in claim 17, wherein the acryl compound represented by Chemical Formula 1 is represented by the following Chemical Formula 2, in which:
R6 is an alkyl group, the alkyl group having about 10 to about 70 carbon atoms and having a linear shape, and
n is an integer of about 10 to about 40, <Chemical Formula 2>

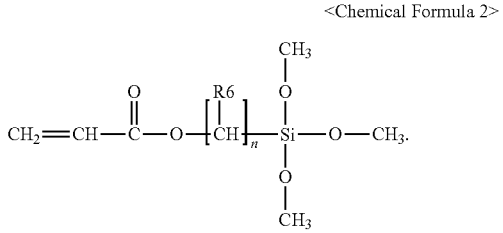

19. The method as claimed in claim 15, wherein the conductive oxide layer includes at least one selected from the group of indium zinc oxide, indium tin oxide, gallium zinc oxide, and zinc aluminum oxide.

20. The method as claimed in claim 15, wherein the first photoresist pattern includes a first thickness portion and a second thickness portion that is thinner than the first thickness portion.

* * * * *